United States Patent
Yun et al.

(10) Patent No.: US 10,020,185 B2
(45) Date of Patent: *Jul. 10, 2018

(54) COMPOSITION FOR FORMING SILICA LAYER, SILICA LAYER, AND ELECTRONIC DEVICE

(71) Applicant: SAMSUNG SDI CO., LTD., Yongin-si, Gyeonggi-do (KR)

(72) Inventors: Hui-Chan Yun, Suwon-si (KR); Woo-Han Kim, Suwon-si (KR); Sang-Ran Koh, Suwon-si (KR); Taek-Soo Kwak, Suwon-si (KR); Bo-Sun Kim, Suwon-si (KR); Jin-Gyo Kim, Suwon-si (KR); Yoong-Hee Na, Suwon-si (KR); Kun-Bae Noh, Suwon-si (KR); Sae-Mi Park, Suwon-si (KR); Jin-Hee Bae, Suwon-si (KR); Jun Sakong, Suwon-si (KR); Eun-Seon Lee, Suwon-si (KR); Wan-Hee Lim, Suwon-si (KR); Jun-Young Jang, Suwon-si (KR); Il Jung, Suwon-si (KR); Byeong-Gyu Hwang, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/720,674

(22) Filed: May 22, 2015

(65) Prior Publication Data

US 2016/0099145 A1   Apr. 7, 2016

(30) Foreign Application Priority Data

Oct. 7, 2014 (KR) .................. 10-2014-0135157
Dec. 24, 2014 (KR) .................. 10-2014-0188905

(51) Int. Cl.
*H01L 21/469* (2006.01)
*H01L 21/02* (2006.01)
(Continued)

(52) U.S. Cl.
CPC ........ *H01L 21/02222* (2013.01); *C01B 33/12* (2013.01); *C09D 1/00* (2013.01);
(Continued)

(58) Field of Classification Search
CPC ...... H01L 21/02222; C01B 33/12; C09D 1/00
See application file for complete search history.

(56) References Cited

U.S. PATENT DOCUMENTS 3,170,962 A   2/1965  Tyler
3,453,304 A   7/1969  Selin
(Continued)

FOREIGN PATENT DOCUMENTS

CN   1260811 A    7/2000
CN   101679923 A  3/2010
(Continued)

OTHER PUBLICATIONS

Taiwan Search Report dated Nov. 9, 2015, for corresponding Taiwan Patent application 104117087, (1 page).
(Continued)

*Primary Examiner* — Selim Ahmed
*Assistant Examiner* — Evan Clinton
(74) *Attorney, Agent, or Firm* — Lewis Roca Rothgerber Christie LLP (57) ABSTRACT

A composition for forming a silica layer including a silicon-containing polymer having a weight average molecular weight of about 20,000 to about 70,000 and a polydispersity
(Continued)

index of about 5.0 to about 17.0 and a solvent; a silica layer manufactured using the same; and an electronic device including the silica layer.

16 Claims, 2 Drawing Sheets

(51) Int. Cl.
*C01B 33/12* (2006.01)
*C09D 1/00* (2006.01)
*H01L 29/06* (2006.01)

(52) U.S. Cl.
CPC .. *H01L 21/02164* (2013.01); *H01L 21/02216* (2013.01); *H01L 21/02282* (2013.01); *H01L 29/0649* (2013.01)

(56) References Cited

U.S. PATENT DOCUMENTS

| | | | |
|---|---|---|---|
| 3,758,624 | A | 9/1973 | Perilstein |
| 4,975,512 | A | 12/1990 | Funayama et al. |
| 4,992,108 | A | 2/1991 | Ward et al. |
| 5,151,390 | A * | 9/1992 | Aoki .............. C04B 35/589 |
| | | | 264/DIG. 19 |
| 5,354,506 | A | 10/1994 | Niebylski |
| 5,459,114 | A | 10/1995 | Kaya et al. |
| 5,688,864 | A | 11/1997 | Goodwin |
| 5,747,623 | A | 5/1998 | Matsuo et al. |
| 6,200,947 | B1 | 3/2001 | Takashima et al. |
| 6,359,096 | B1 | 3/2002 | Zhong et al. |
| 6,413,202 | B1 | 7/2002 | Leonte et al. |
| 6,451,955 | B1 | 9/2002 | Hausladen et al. |
| 6,767,641 | B1 * | 7/2004 | Shimizu ............ C23C 18/1212 |
| | | | 257/E21.261 |
| 8,058,711 | B2 | 11/2011 | Lim et al. |
| 8,252,101 | B1 | 8/2012 | Glemba et al. |
| 8,372,479 | B2 | 2/2013 | Di Loreto |
| 2002/0015851 | A1 | 2/2002 | Higuchi et al. |
| 2003/0092565 | A1 | 5/2003 | Chaudhari et al. |
| 2003/0105264 | A1 | 6/2003 | Bedwell et al. |
| 2004/0013858 | A1 | 1/2004 | Hacker et al. |
| 2005/0181566 | A1 | 8/2005 | Machida et al. |
| 2005/0238392 | A1 | 10/2005 | Okamoto et al. |
| 2007/0049616 | A1 | 3/2007 | Ksander et al. |
| 2007/0161530 | A1 | 7/2007 | Kaneda et al. |
| 2008/0102211 | A1 | 5/2008 | Matsuo et al. |
| 2008/0234163 | A1 | 9/2008 | Shimizu et al. |
| 2010/0139697 | A1 | 6/2010 | Martens et al. |
| 2010/0167535 | A1 | 7/2010 | Nishiwaki et al. |
| 2012/0034767 | A1 | 2/2012 | Xiao et al. |
| 2012/0064722 | A1 | 3/2012 | Sakurai |
| 2012/0164382 | A1 | 6/2012 | Yun et al. |
| 2012/0177829 | A1 * | 7/2012 | Lim .................. C08G 77/54 |
| | | | 427/377 |
| 2012/0263867 | A1 | 10/2012 | Kanbe et al. |
| 2013/0017662 | A1 | 1/2013 | Park et al. |
| 2013/0252869 | A1 | 9/2013 | Oh et al. |
| 2013/0323904 | A1 * | 12/2013 | Takano ............ H01L 21/02164 |
| | | | 438/424 |
| 2014/0057003 | A1 | 2/2014 | Johnson |
| 2014/0099510 | A1 | 4/2014 | Chiong et al. |
| 2014/0099554 | A1 | 4/2014 | Inoue et al. |
| 2014/0106576 | A1 | 4/2014 | Morita et al. |
| 2014/0120352 | A1 | 5/2014 | Miyahara et al. |
| 2014/0315367 | A1 | 10/2014 | Bae et al. |
| 2015/0093545 | A1 * | 4/2015 | Han .................... C09D 183/16 |
| | | | 428/156 |
| 2015/0234278 | A1 | 8/2015 | Hatakeyama et al. |
| 2016/0315286 | A1 | 10/2016 | Kuroki et al. |

FOREIGN PATENT DOCUMENTS

| | | |
|---|---|---|
| CN | 101111575 B | 6/2010 |
| CN | 102569060 A | 7/2012 |
| CN | 102874813 A | 1/2013 |
| CN | 103582559 A | 2/2014 |
| CN | 103910885 A | 7/2014 |
| JP | 5-148720 A | 6/1993 |
| JP | 05-243223 A | 9/1993 |
| JP | 10-046108 A | 2/1998 |
| JP | 10-194826 A | 7/1998 |
| JP | 10321719 A | 12/1998 |
| JP | 2001-308090 A | 11/2001 |
| JP | 2003-197611 A | 7/2003 |
| JP | 2004-96076 A | 3/2004 |
| JP | 2004-331733 A | 11/2004 |
| JP | 3760028 B2 | 3/2006 |
| JP | 2006-253310 A | 9/2006 |
| JP | 3912697 B2 | 2/2007 |
| JP | 4101322 B2 | 3/2008 |
| JP | 2008-088224 A | 4/2008 |
| JP | 4349390 B2 | 10/2009 |
| JP | 2010-59280 A | 3/2010 |
| JP | 2010-61722 A | 3/2010 |
| JP | 2010-177647 A | 8/2010 |
| JP | 2011-142207 A | 7/2011 |
| JP | 2012-983 A | 1/2012 |
| JP | 2012-94739 A | 5/2012 |
| JP | 5250813 B2 | 7/2013 |
| JP | 2015-58687 A | 3/2015 |
| JP | 2015-512561 A | 4/2015 |
| JP | 5691175 B2 | 4/2015 |
| KR | 2001-0006446 A | 1/2001 |
| KR | 10-2002-0025680 A | 4/2002 |
| KR | 10-0364026 B1 | 12/2002 |
| KR | 10-0397174 B1 | 9/2003 |
| KR | 10-0464859 B1 | 1/2005 |
| KR | 10-2005-0056872 A | 6/2005 |
| KR | 10-0503527 B1 | 7/2005 |
| KR | 10-2005-0084617 A | 8/2005 |
| KR | 10-2005-0104610 A | 11/2005 |
| KR | 10-0611115 B1 | 8/2006 |
| KR | 10-2006-0134098 A | 12/2006 |
| KR | 10-2007-0028518 A | 3/2007 |
| KR | 10-2007-0108214 A | 11/2007 |
| KR | 10-0859276 B1 | 9/2008 |
| KR | 10-2010-0138997 | 12/2010 |
| KR | 10-2011-0006586 A | 1/2011 |
| KR | 10-2011-0012574 A | 2/2011 |
| KR | 10-2011-0023411 A | 3/2011 |
| KR | 10-2011-0062158 A | 6/2011 |
| KR | 10-2011-0073176 A | 6/2011 |
| KR | 10-2011-0081043 A | 7/2011 |
| KR | 10-1142369 B1 | 5/2012 |
| KR | 10-2012-0071311 A | 7/2012 |
| KR | 10-2013-0064026 | 6/2013 |
| KR | 10-2013-0064066 A | 6/2013 |
| KR | 10-1332306 B1 | 11/2013 |
| KR | 10-2013-0137596 | 12/2013 |
| KR | 10-2014-0011506 A | 1/2014 |
| KR | 10-2014-0063518 | 5/2014 |
| KR | 10-2014-0085119 A | 7/2014 |
| KR | 10-2014-0085264 A | 7/2014 |
| KR | 10-2014-0087644 A | 7/2014 |
| KR | 10-2014-0087998 | 7/2014 |
| KR | 10-2014-0087998 A | 7/2014 |
| KR | 10-2014-0125203 A | 10/2014 |
| KR | 10-2014-0127313 A | 11/2014 |
| KR | 10-2014-0139946 | 12/2014 |
| KR | 10-2015-0019949 A | 2/2015 |
| KR | 10-2015-0039084 | 4/2015 |
| KR | 10-2015-0039084 A | 4/2015 |
| TW | 200946453 A1 | 11/2009 |
| TW | 201132716 A1 | 10/2011 |
| TW | 201233741 A1 | 8/2012 |
| TW | 201439685 A | 10/2014 |
| TW | 201441365 A | 11/2014 |
| TW | 201522508 A | 6/2015 |

(56) References Cited

FOREIGN PATENT DOCUMENTS

OTHER PUBLICATIONS

Machine English Translation of JP 3912697 B2, Feb. 9, 2007, 11 Pages.
Machine English Translation of JP 4101322 B2, Mar. 28, 2008, 9 Pages.
Korean Patent Abstracts for Korean Publication No. 1020040068989 A, Corresponding to Korean Patent No. 10-0859276 B1, Sep. 19, 2008, 1 Page.
TIPO Search Report dated May 24, 2016, for corresponding Taiwanese Patent Application No. 104129710 (1 page).
TIPO Search Report dated Aug. 2, 2016, for corresponding Taiwanese Patent Application No. 104125161 (1 page).
Partial English Translation of relevant parts of TW 201441365 A dated Nov. 1, 2014.
U.S. Office Action dated Jun. 17, 2016, for cross-reference U.S. Appl. No. 14/488,440 (7 pages).
U.S. Office Action dated Aug. 12, 2016, for cross-reference U.S. Appl. No. 14/842,632 (9 pages).
U.S. Office Action dated Aug. 18, 2016, for cross-reference U.S. Appl. No. 14/754,346 (11 pages).
U.S. Office Action dated Nov. 14, 2016, for cross-reference U.S. Appl. No. 14/488,440 (10 pages).
U.S. Office Action dated Dec. 15, 2016, for cross-reference U.S. Appl. No. 15/061,670 (10 pages).
KIPO Office action dated Mar. 22, 2017, for corresponding Korean Patent Application No. 10-2014-0188905 (6 pages).
U.S. Advisory Action dated May 8, 2017, issued in cross-reference U.S. Appl. No. 14/754,346 (6 pages).
U.S. Office Action dated May 8, 2017, issued in cross-reference U.S. Appl. No. 15/061,670 (10 pages).
U.S. Office Action dated Jun. 21, 2017, issued in cross-reference U.S. Appl. No. 14/754,346 (8 pages).
U.S. Office Action dated Jan. 20, 2017, for cross reference U.S. Appl. No. 14/842,632 (7 pages).
U.S. Office Action dated Mar. 2, 2017, for cross reference U.S. Appl. No. 14/784,346 (9 pages).
U.S. Office Action dated Mar. 7, 2017, issued in cross-reference U.S. Appl. No. 14/839,642 (10 pages).
U.S. Office Action dated Jun. 20, 2017, issued in cross-reference U.S. Appl. No. 14/839,642 (10 pages).
SIPO Office Action dated Aug. 2, 2017, corresponding to Chinese Patent Application No. 201510591897.4 (8 pages).
U.S. Office Action dated Sep. 14, 2017, issued in cross-reference U.S. Appl. No. 15/061,670 (8 pages).
U.S. Office Action dated Sep. 21, 2017, issued in cross-reference U.S. Appl. No. 14/842,632 (6 pages).
U.S. Advisory Action dated Oct. 3, 2017, issued in cross-reference U.S. Appl. No. 14/839,642 (4 pages).
KIPO Office Action dated May 1, 2017, for corresponding Korean Patent Application No. 10-2014-0184766 (5 pages).
Heemken et al., "Comparison of ASE and SFE with Soxhlet, Sonication, and Methanolic Saponification Extractions for the Determination of Organic Micropollutants in Marine Particulate Matter," Analytical Chemistry, vol. 69, No. 11, Jun. 1, 1997, pp. 2171-2180.
TIPO Search Report dated Sep. 7, 2016, corresponding to Taiwanese Patent Application No. 105108604 (1 page).
U.S. Office Action dated Nov. 3, 2017, for U.S. Appl. No. 14/754,346 (8 pages).
KIPO Notice of Allowance dated Oct. 27, 2017, for corresponding Korean Patent Application No. 10-2014-0188905 (3 pages).
U.S. Office Action dated Nov. 22, 2017, issued in U.S. Appl. No. 14/839,642 (10 pages).
Chinese Search Report from the SIPO Office Action dated Dec. 19, 2017, corresponding to Chinese Patent Application No. 201510452174.6 (2 pgs).
KIPO Office Action dated Aug. 21, 2017, corresponding to Korean Patent Application No. 10-2015-0079441 (9 pages).
KIPO Office Action dated Nov. 13, 2017, corresponding to Korean Patent Application No. 10-2015-0109028 (6 pages).
U.S. Final Office Action dated Jan. 26, 2018, issued in U.S. Appl. No. 15/061,670 (6 pages).
U.S. Office Action dated Feb. 7, 2018, issued in U.S. Appl. No. 14/754,346 (9 pages).

\* cited by examiner

COMPOSITION FOR FORMING SILICA LAYER, SILICA LAYER, AND ELECTRONIC DEVICE

CROSS-REFERENCE TO RELATED APPLICATION

This application claims priority to and the benefit of Korean Patent Application No. 10-2014-0135157, filed in the Korean Intellectual Property Office on Oct. 7, 2014, and Korean Patent Application No. 10-2014-0188905, filed in the Korean Intellectual Property Office on Dec. 24, 2014, the entire contents of all which are incorporated herein by reference.

BACKGROUND

1. Field

This disclosure relates to a composition for forming a silica layer, a silica layer, and an electronic device including the silica layer.

2. Description of the Related Art

With the development of semiconductor technology, researches on a semiconductor memory cell with high integration and a high speed have been made in order to increase integration in a smaller semiconductor chip and improve performance. However, as the semiconductor requires high integration and a space between wires becomes narrower, an RC delay, a cross-talk, deterioration of a response speed and/or the like may occur and thus, causes a problem in terms of a semiconductor interconnection. In order to solve this problem, appropriate separation among devices may be needed.

Accordingly, the appropriate separation among devices is performed by widely using a silica layer formed of a silicon-containing material as an interlayer insulating layer of a semiconductor device, a planarization layer, a passivation film, an insulation layer among devices and the like. The silica layer is used as a protective layer, an insulation layer and the like for a display device and the like as well as the semiconductor device. For example, Korean Patent Laid-Open No. 2002-0025680 discloses a semiconductor device including a silicon nitride layer, Korean Patent Laid-Open No. 2005-0104610 discloses a display device including an insulation layer as a silicon layer, and the entire contents of all which are incorporated herein by reference.

The silica layer is formed by in general coating a silicon-containing material in a set or predetermined region of a device and curing it, and thus, a material satisfying both gap-fill characteristics and gap etch characteristics is required when the silica layer is formed.

SUMMARY

An aspect of an embodiment is directed toward a composition for forming a silica layer capable of ensuring gap-fill characteristics and gap etch characteristics (concurrently or simultaneously).

An aspect of another embodiment is directed toward a silica layer using the composition.

An aspect of yet another embodiment is directed toward an electronic device including the silica layer.

According to one embodiment, a composition for forming a silica layer includes a silicon-containing polymer having a weight average molecular weight of about 20,000 to about 70,000 and a polydispersity index of about 5.0 to about 17.0 and a solvent.

The silicon-containing polymer may include a silicon-containing polymer having a weight average molecular weight of about 20,000 to about 50,000 and a polydispersity index of about 5.0 to about 14.0, a silicon-containing polymer having a weight average molecular weight of greater than about 50,000 and less than or equal to about 70,000 and a polydispersity index of about 11.5 to about 17.0, or a combination thereof.

The silicon-containing polymer may be polysilazane, polysiloxazane, or a combination thereof.

The silicon-containing polymer may have a polydispersity index of about 5.3 to about 15.5.

The silicon-containing polymer may have a weight average molecular weight of about 22,000 to about 65,000.

The solvent may include at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

The silicon-containing polymer may be included in an amount of about 0.1 to about 30 wt % based on the total amount of the composition for forming a silica layer.

The oxygen content of the silicon-containing polymer may range from about 0.01 wt % to about 3 wt % based on 100 wt % of the silicon-containing polymer, and the —SiH3 group content of the silicon-containing polymer may range from about 15% to about 40% based on the total amount of a Si—H bond in the silicon-containing polymer.

According to another embodiment, a silica layer is manufactured from (using) the composition.

According to yet another embodiment, an electronic device including the silica layer is provided.

In view of the foregoing and according to one or more embodiments, a silica layer capable of ensuring a film flatness and denseness inside gaps (concurrently or simultaneously) may be realized.

DETAILED DESCRIPTION

Exemplary embodiments of the present invention will hereinafter be described in more detail, and may be easily performed by those who have common knowledge in the related art. However, this disclosure may be embodied in many different forms and is not construed as limited to the exemplary embodiments set forth herein.

As used herein, when a definition is not otherwise provided, the term 'substituted' refers to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, an alkyl group, a C2 to C16 alkenyl group, a C2 to C16 alkynyl group, aryl group, a C7 to C13 arylalkyl group, a C1 to C4 oxyalkyl group, a C1 to C20 heteroalkyl group, a C3 to C20 heteroarylalkyl group, a cycloalkyl group, a C3 to C15 cycloalkenyl group, a C6 to C15 cycloalkynyl group, a heterocycloalkyl group, and a combination thereof, instead of hydrogen of a compound.

Hereinafter, a composition for forming a silica layer according to one embodiment is described.

The composition for forming a silica layer according to one embodiment includes a silicon-containing polymer and a solvent.

The silicon-containing polymer may be a silicon (Si) atom-containing polymer without a particular limit, and may be, for example polysilazane, polysiloxazane, or a combination thereof.

The silicon-containing polymer may have a weight average molecular weight of about 20,000 to about 70,000, and a polydispersity index (PDI) of about 5.0 to about 17.0. According to one embodiment, the composition for forming a silica layer includes a silicon-containing polymer having a weight average molecular weight and a polydispersity index within each set or predetermined range and thus, may increase gap density of a layer as well as secure uniformity of the layer and thus, reducing or minimizing a defect inside the layer.

The silicon-containing polymer may include a silicon-containing polymer having a weight average molecular weight of about 20,000 to about 50,000 and a polydispersity index of about 5.0 to about 14.0, a silicon-containing polymer having a weight average molecular weight of greater than about 50,000 and less than or equal to about 70,000 and a polydispersity index of about 11.5 to about 17.0, or a combination thereof. The composition including the silicon-containing polymer satisfying a weight average molecular weight and a polydispersity index within each set or predetermined range has excellent etch characteristics as well as excellent coating properties and thus, form a uniform layer. In addition, the composition is cured for a relatively longer time and may stably form a layer.

Within the ranges, the silicon-containing polymer may have, for example a polydispersity index of about 5.3 to about 15.5, and the silicon-containing polymer may have, for example a weight average molecular weight of about 22,000 to about 65,000.

For example, the silicon-containing polymer may be included in an amount of about 0.1 to about 30 wt %, and specifically about 0.2 wt % to about 3 wt % based on the total amount of the composition for forming a silica layer.

When the silicon-containing polymer is included within the range, a composition including the silicon-containing polymer may be prevented or protected from contraction during heat treatment, and thus, a charge pattern formed thereof may be prevented or protected from cracking (forming a crack). More specifically, the silicon-containing polymer may be included in an amount of about 0.4 to about 2 wt %.

In addition, the silicon-containing polymer may include a moiety represented by —SiH3 at the terminal end, and the —SiH3 group content of the silicon-containing polymer may range from about 15% to about 40% based on the total amount of a Si—H bond in the silicon-containing polymer. Herein, the oxygen content is measured by using FlashEA 1112 (Thermo Fisher Scientific Inc.), and the SiH3/SiH is measured by using proton NM of 200 MHz: AC-200 (Bruker Co.).

The silicon-containing polymer may be included in an amount of about 0.1 to about 30 wt % based on the total amount of the composition for forming a silica layer. When the silicon-containing polymer is included within the range, appropriate viscosity may not only be maintained but an even and uniform layer may also be formed without a gap (a void) during gap-fill.

The solvent may use an aromatic compound, an aliphatic compound, a saturated hydrocarbon compound, ethers, esters, ketones, and/or the like, and may be specifically selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

In particular, at least one of the solvents has a high boiling point of greater than or equal to 130° C. Accordingly, flatness of a layer may be increased.

The solvent may be included in a balance amount except for the components based on the total weight of the composition for forming a silica layer.

The composition for forming a silica layer may further include a thermal acid generator (TAG).

The thermal acid generator may include any compound without particular limit, if it generates acid (H+) by heat. In particular, it may include a compound activated at 90° C. or higher and generating sufficient acid and also, having low volatility. Such a thermal acid generator may be, for example selected from nitrobenzyl tosylate, nitrobenzyl benzenesulfonate, phenol sulfonate, and a combination thereof.

The thermal acid generator may be included in an amount of about 0.01 to about 25 wt % based on the total amount of the composition for forming a silica layer.

The composition for forming a silica layer may further include a surfactant.

The surfactant is not particularly limited, and may be, for example: a non-ionic surfactant such as polyoxyethylene alkyl ethers (such as polyoxyethylene lauryl ether, polyoxyethylene stearyl ether, polyoxyethylene cetyl ether, polyoxyethylene oleyl ether, or the like), polyoxyethylene alkylallyl ethers (such as polyoxyethylenenonyl phenol ether, or the like), polyoxyethylene•polyoxypropylene block copolymers, polyoxyethylene sorbitan fatty acid ester (such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, or the like); a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and/or the like; and/or other silicone-based surfactant (such as a organosiloxane polymer KP341 (Shin-Etsu Chemical Co., Ltd.), or the like).

The surfactant may be included in an amount of about 0.001 to about 10 wt % based on the total amount of the composition for forming a silica layer. Within the range, dispersion of a solution, uniformity in thickness, and filling properties of a layer may be improved.

According to another embodiment, a silica layer is manufactured from (using) the composition.

The method of manufacturing a silica layer (e.g., a silica-based insulation layer) includes coating the composition on a substrate; drying the substrate coated with the composition; and curing the substrate.

The composition for forming a silica layer may be in the form of a solution including the silicon-containing polymer and a solvent, and may be coated using a solution process, for example spin coating, slit coating, screen printing, inkjet, ODF (one drop filling) or a combination thereof. The curing process of the substrate may include heat-treating at a temperature, for example about 150° C. or greater.

The silica layer may be, for example an insulation layer, a filling layer, a protective layer (such as a hard coating or the like), a semiconductor capacitor, and/or the like. The insulation layer may be used, for example between a transistor device and a bitline, between a transistor device and a capacitor, without limitation.

According to another embodiment, an electronic device including the silica layer is provided. The electronic device may include a display device, a semiconductor, an image sensor, and/or the like.

Hereinafter, the following examples illustrate embodiments of the present invention in more detail. However, these examples are exemplary, and the present disclosure is not limited thereto.

Preparation of Composition for Forming Silica Layer

Comparative Example 1

The internal atmosphere of a reactor equipped with a 2 L agitator and a temperature controller was substituted with dry nitrogen. 1,500 g of dry pyridine was put in the reactor, and then, the reactor was maintained at 0° C. Subsequently, 100 g of dichlorosilane was slowly injected thereinto over one hour. Next, 70 g of ammonia was slowly injected thereinto over 3 hours, while the reactor was agitated. Then, dry nitrogen was injected thereinto over 30 minutes, and ammonia remaining in the reactor was removed. The obtained white slurry-phased product was filtered through a 1 μm Teflon filter under a dry nitrogen atmosphere, thereby obtaining 1,000 g of a filtered solution. Then, 1,000 g of dry xylene was added thereto, the solvent of the mixture was repetitively substituted from pyridine to xylene, three times, by using a rotary evaporator to adjust its concentration into 30 wt %, and the concentrated product was filtered through a Teflon filter having a pore size of 0.03 μm.

300 g of dry pyridine was added to the filtered solution, and the mixture was heated at 100° C. until its weight average molecular weight reached 23,000.

Then, 1000 g of dry dibutylether was added thereto, and a solvent in the obtained mixture was repetitively substituted with dibutylether, three times, by using a rotary evaporator to adjust its solid (concentration) into 20 wt %.

Accordingly, polysilazane having a weight average molecular weight of 23,000 and a polydispersity index of 4.8 was obtained through the process. In the present specification, the weight average molecular weight and polydispersity index of the polysilazane were respectively measured by using GPC (PLC Pump 1515, RI Detector 2414) made by Waters.

Subsequently, the obtained polysilazane solution was filtered, thereby preparing a composition for forming a silica layer.

Comparative Example 2

A heat treatment was performed through the same process as Comparative Example 1 until the weight average molecular weight became 100,000. Then, a composition for forming a silica layer was prepared by filtering the polysilazane dibutylether solution having a weight average molecular weight of 100,000 and a polydispersity index of 13.5 through the same solvent substitution manner as Comparative Example 1.

Comparative Example 3

A heat treatment was performed through the same process as Comparative Example 1 until the weight average molecular weight became 140,000. Then, a composition for forming a silica layer was prepared by filtering the polysilazane dibutylether solution having a weight average molecular weight of 140,000 and a polydispersity index of 17.5 through the same solvent substitution manner as Comparative Example 1.

Example 1

A heat treatment was performed through the same process as Comparative Example 1 until the weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution according to Comparative Example 2 in a weight ratio of 8:2, thereby obtaining a polysilazane dibutylether solution having a weight average molecular weight of 23,000 and a polydispersity index of 6.4. The obtained polysilazane solution was filtered, thereby preparing a composition for forming a silica layer.

Example 2

A heat treatment was performed through the same process as Comparative Example 1 until a weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution of Comparative Example 3 in a weight ratio of 9:1, thereby obtaining a polysilazane dibutylether solution having a weight average molecular weight of 23,000 and a polydispersity index of 7.3. The obtained polysilazane solution was filtered, thereby preparing a composition for forming a silica layer.

Example 3

A heat treatment was performed through the same process as Comparative Example 1 until a weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution of Comparative Example 2 in a weight ratio of 6:4, thereby obtaining a polysilazane dibutylether solution having a weight average molecular weight of 46,000 and a polydispersity index of 11.7. The obtained polysilazane solution was filtered, thereby preparing a composition for forming a silica layer.

Example 4

A heat treatment was performed through the same process as Comparative Example 1 until a weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution of Comparative Example 3 in a weight ratio of 3:1, thereby obtaining a polysilazane dibutylether solution having a weight average molecular weight of 46,000 and a polydispersity index of 12.6. The obtained polysilazane solution was filtered, thereby preparing a composition for forming a silica layer.

Example 5

A heat treatment was performed through the same process as Comparative Example 1 until a weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution of Comparative Example 2 in a weight ratio of 4:6, thereby obtaining a polysilazane dibutylether solution having a weight average molecular weight of 61,000 and a polydispersity index of 14.9. The obtained polysilazane solution was filtered, thereby preparing a composition for forming a silica layer.

Example 6

A heat treatment was performed through the same process as Comparative Example 1 until a weight average molecular weight became 8,000. Then, a polysilazane dibutylether solution having a weight average molecular weight of 8,000 and a polydispersity index of 2.9 was obtained through the same solvent substitution manner as Comparative Example 1.

The solution was mixed with the polysilazane dibutylether solution of Comparative Example 3 in a weight ratio of 6:4, thereby obtaining a polysilazane dibutylether solution having a weight average molecular weight of 61,000 and a polydispersity index of 15.4. The obtained polysilazane solution was filtered, thereby preparing a composition for forming a silica layer.

Example 7

A heat treatment was performed through the same process as Comparative Example 1 until a weight average molecular weight became 10,000. Then, a polysilazane dibutylether solution (1) having a weight average molecular weight of 10,000 and a polydispersity index of 3.2 was obtained through the same solvent substitution manner as Comparative Example 1.

Then, a heat treatment was performed through the same process as Comparative Example 1 until a weight average molecular weight became 30,000. Then, a polysilazane dibutylether solution (2) having a weight average molecular weight of 30,000 and a polydispersity index of 5.8 was obtained through the same solvent substitution manner as Comparative Example 1.

Then, the polysilazane dibutylether solutions (1) and (2) were mixed in a ratio of 4:6 (weight ratio), and then, a polysilazane dibutylether solution having a weight average molecular weight of 22,000 and a polydispersity index of 5.3 was obtained. The obtained polysilazane solution was filtered, thereby preparing a composition for forming a silica layer.

The specifications of the gel permeation chromatography (GPC) used are as below:
1. Model
Waters GPC (PLC Pump 1515, RI Detector 2414)
Kind of Column: Shodex LF-804
2. Measurement Conditions
Eluent: THF
Measurement Concentration: 1% (Xylene)
Injection volume: 50 μl
Velocity of Fluid: 1 ml/min
3. Calibration Curve
Kind of STD: Poly Styrene STD (Shodex)
Numbers: 12 (ea)
(580/1,200/2,340/3,950/6,180/13,000/16,500/20,000/55,100/133,000/288,000/1,280,000)
Accuracy: Quintic Polynomial, R2>0.99
Evaluation 1: Gap-Fill Characteristics Each composition for forming a silica layer according to Comparative Examples 1 to 3 and Examples 1 to 7 was coated on a patterned silicon wafer and baked to form a thin film. A pattern of the patterned silicon wafer has a width of about 40 nm, and a depth of about 1 μm. Subsequently, after attaching the cross-section of the film to a mount, platinum sputtering was performed with 6 mA for 8 seconds by using an HR coater. The pre-treated samples were magnified 100,000 times by using an electron microscope (S5500, Hitachi Ltd.) and examined. Fifty trenches were randomly selected in the samples. Then, samples having a void in the fifty trenches were evaluated as "Unfavorable", and samples having no void in the fifty trenches were evaluated as "Good". The results are provided in the following Table 1.

TABLE 1

|  | Gap-fill |
| --- | --- |
| Example 1 | Good |
| Example 2 | Good |
| Example 3 | Good |
| Example 4 | Good |
| Example 5 | Good |
| Example 6 | Good |
| Example 7 | Good |
| Comparative Example 1 | Good |
| Comparative Example 2 | Unfavorable |
| Comparative Example 3 | Unfavorable |

Figure 1:
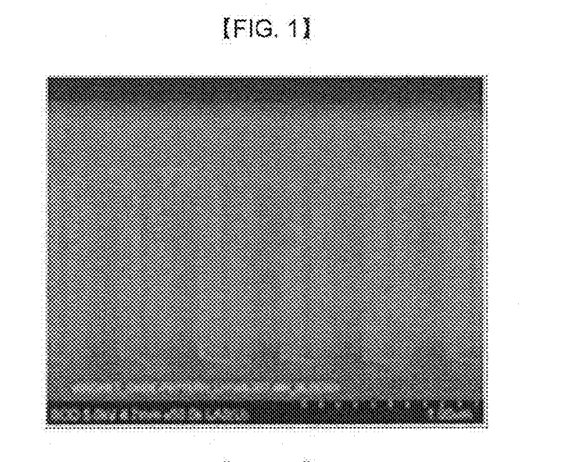
FIG. 1 is an electron microscope photograph showing a silica layer having good gap-fill characteristics manufactured using the composition according to Example 1.
Figure 2:
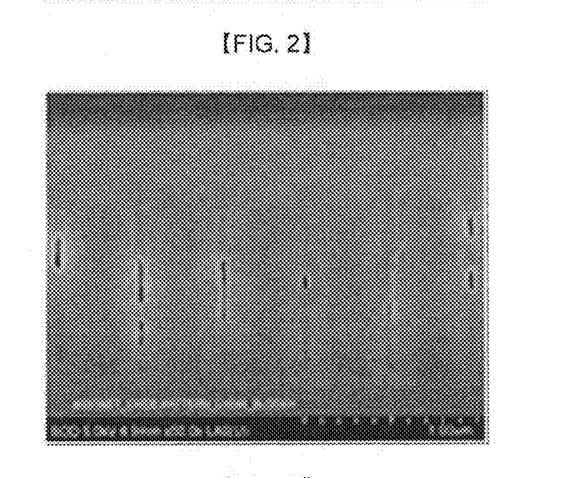
FIG. 2 is an electron microscope photograph showing a silica layer having insufficient gap-fill characteristics manufactured using the composition according to Comparative Example 2.

Referring to Table 1, FIGS. 1 and 2, the compositions for forming a silica layer according to Examples 1 to 7 showed gap-fill characteristics result of "good", while the compositions for forming a silica layer according to Comparative Examples 2 and 3 showed gap-fill characteristics result of "unfavorable". Also, FIG. 1 is an electron microscope photograph showing a silica layer having good gap-fill characteristics manufactured using the composition according to Example 1, and FIG. 2 is an electron microscope photograph showing a silica layer having insufficient gap-fill characteristics manufactured using the composition according to Comparative Example 2. As such, it can be derived that gap-fill characteristics of a film formed of a polysilazane composition having a weight average molecular weight and a polydispersity index within each set or predetermined range according to example embodiments are all good (excellent).

Evaluation 2: Gap Etch Characteristics

Each composition for forming a silica layer according to Comparative Examples 1 to 3 and Examples 1 to 7 was coated on a patterned silicon wafer and then, baked, thereby forming a thin film. Subsequently, the cross-section of the film was dipped in an etching solution (an aqueous solution including HF of 0.5 wt %) for 30 seconds while the etching solution was maintained at 18° C. and then, cleaned with pure water for 30 seconds. Then, moisture remaining there was removed by using nitrogen. Then, the cross-section was attached to a mount and then, Pt-sputtered with 6 mA for 8 seconds by using an HR coater. The pre-treated sample was magnified 100,000 times by using an electron microscope (S5500, Hitachi Ltd.), and examined. The gap etch characteristics were evaluated according to a degree of a vacant space in the samples.

The results are provided in the following Table 2.

TABLE 2

| | Gap etch |
|---|---|
| Example 1 | Good |
| Example 2 | Good |
| Example 3 | Very good |
| Example 4 | Very good |
| Example 5 | Very good |
| Example 6 | Very good |
| Example 7 | Very good |
| Comparative Example 1 | Unfavorable |
| Comparative Example 2 | — |
| Comparative Example 3 | — |

Figure 3:
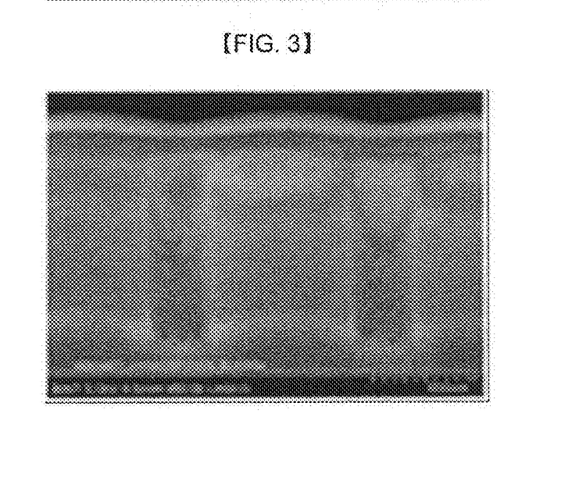
FIG. 3 is an electron microscope photograph showing a silica layer having very good gap etch characteristics manufactured using the composition according to Example 3.
Figure 4:
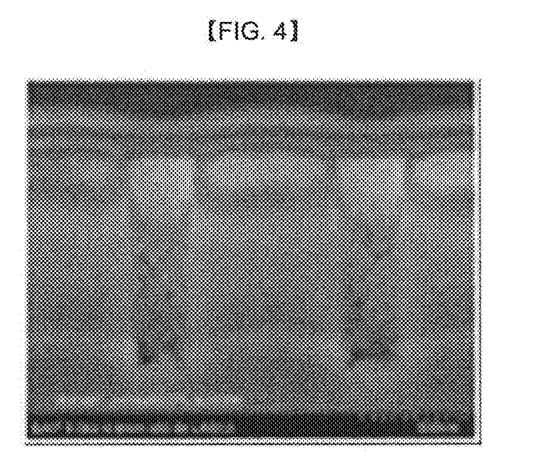
FIG. 4 is an electron microscope photograph showing a silica layer having good gap etch characteristics manufactured using the composition according to Example 1.
Figure 5:
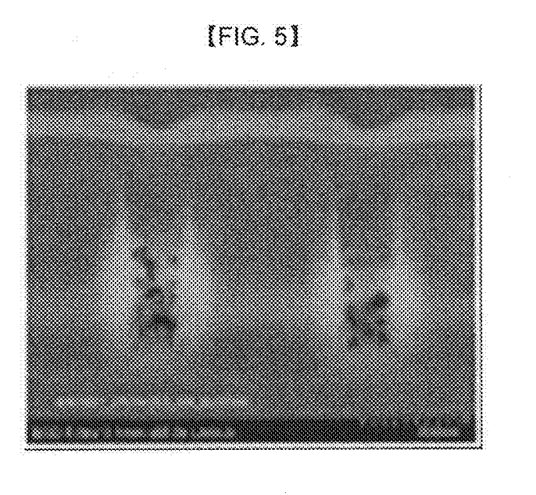
FIG. 5 is an electron microscope photograph showing a silica layer having unfavorable gap etch characteristics manufactured using the composition according to Comparative Example 1.

Referring to Table 2, and FIGS. 3 to 5, the compositions for forming a silica layer according to Examples 1 to 7 showed gap etch characteristic results of "good" or "very good", while the composition for forming a silica layer according to Comparative Example 1 showed gap etch characteristic results of "unfavorable". In addition, the composition for forming a silica layer according to Comparative Examples 2 and 3 showed "unfavorable" gap-fill characteristics, which may not be evaluated. Also, FIG. 3 is an electron microscope photograph showing a silica layer having very good gap etch characteristics manufactured using the composition according to Example 3, FIG. 4 is an electron microscope photograph showing a silica layer having good gap etch characteristics manufactured using the composition according to Example 1, and FIG. 5 is an electron microscope photograph showing a silica layer having unfavorable gap etch characteristics manufactured using the composition according to Comparative Example 1. As such, Referring to Table 2, FIGS. 3, 4, and 5, and according to example embodiments, a layer formed of a polysilazane composition having a weight average molecular weight and a polydispersity index within a set or predetermined range has excellent gap etch characteristics.

Evaluation 3: Gelation Time

The compositions for forming a silica layer according to Comparative Examples 1 to 3 and Examples 1 to 7 were respectively filled in a half of a 40 ml glass vial and allowed to stand in a clean room at 22° C./50RH %. Then, the glass vial was examined with naked eyes every hour to check whether it was gelated or not. The gelation time means a required time for the composition to become a gel state. The gelation time of less than or equal to 7 hours was unfavorable, the gelation time ranging from greater than 7 hours to less than or equal to 12 hours was good, and the gelation time of greater than or equal to 12 hours was very good.

The results are provided in the following Table 3.

TABLE 3

| | Gelation time (Hr) |
|---|---|
| Example 1 | Very good |
| Example 2 | Very good |
| Example 3 | Very good |
| Example 4 | Good |
| Example 5 | Good |
| Example 6 | Good |
| Example 7 | Good |
| Comparative Example 1 | Good |
| Comparative Example 2 | Unfavorable |
| Comparative Example 3 | Unfavorable |

Referring to Table 3, the compositions for forming a silica layer according to Examples 1 to 7 showed a gelation time result of "good" or "very good", while the compositions for forming a silica layer according to Comparative Examples 2 and 3 showed a gelation time result of "unfavorable". These results are that a layer formed of a polysilazane composition having weight average molecular weight and a polydispersity index within each set or predetermined range according to example embodiments showed relatively long gelation time and thus, excellent stability of the composition.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 1 12, first paragraph, and 35 U.S.C. § 132(a).

As used herein, the terms "use," "using," and "used" may be considered synonymous with the terms "utilize," "utilizing," and "utilized," respectively.

The electronic device may be implemented with logic gates or with any other embodiment of a processing unit or processor. The term, "processing unit" or "processor", is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). The electronic device and/or any other relevant devices or components according to embodiments of the present invention described herein may be implemented utilizing any suitable hardware or a combination of software, firmware, and hardware. For example, the various components of the device may be formed on or with one integrated circuit (IC) chip or on or with separate IC chips. Further, the various components of the device may be implemented on or with a flexible printed circuit film, a tape carrier package (TCP), a printed circuit board (PCB), or formed on or with one substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A composition for forming a silica layer, comprising: a silicon-containing polymer and a solvent, the silicon-containing polymer comprising a silicon-containing polymer having a weight average molecular weight of about 20,000 to about 50,000 and a polydispersity index of about 5.0 to about 14.0, a silicon-containing polymer having a weight average molecular weight of greater than about 50,000 and less than or equal to about 70,000 and a polydispersity index of about 11.5 to about 17.0, or a combination thereof.

2. The composition of claim 1, wherein the silicon-containing polymer is polysilazane, polysiloxazane, or a combination thereof.

3. The composition of claim 2, wherein the oxygen content of the silicon-containing polymer ranges from about 0.01 wt % to about 3 wt % based on 100 wt % of the silicon-containing polymer, and
the —$SiH_3$ group content of the silicon-containing polymer ranges from about 15% to about 40% based on the total amount of a Si—H bond in the silicon-containing polymer.

4. The composition of claim 1, wherein the silicon-containing polymer has a polydispersity index of about 5.3 to about 15.5.

5. The composition of claim 1, wherein the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

6. The composition of claim 1, wherein the silicon-containing polymer is included in an amount of about 0.1 to about 30 wt % based on the total amount of the composition for forming a silica layer.

7. A silica layer manufactured from the composition of claim 1.

8. An electronic device comprising the silica layer of claim 7.

9. A method of manufacturing a silica layer, the method comprising:
forming a composition for forming a silica layer, the composition comprising:
a solvent, and
a silicon-containing polymer comprising a silicon-containing polymer having a weight average molecular weight of about 20,000 to about 50,000 and a polydispersity index of about 5.0 to about 14.0, a silicon-containing polymer having a weight average molecular weight of greater than about 50,000 and less than or equal to about 70,000 and a polydispersity index of about 11.5 to about 17.0, or a combination thereof,
coating the composition on a substrate;
drying the coated substrate;
curing the dried substrate, and
forming the silica layer from the cured substrate.

10. The method of claim 9, wherein the silicon-containing polymer is polysilazane, polysiloxazane, or a combination thereof.

11. The method of claim 10, wherein the oxygen content of the silicon-containing polymer ranges from about 0.01 wt % to about 3 wt % based on 100 wt % of the silicon-containing polymer, and
the —$SiH_3$ group content of the silicon-containing polymer ranges from about 15% to about 40% based on the total amount of a Si—H bond in the silicon-containing polymer.

12. The method of claim 9, wherein the silicon-containing polymer has a polydispersity index of about 5.3 to about 15.5.

13. The method of claim 9, wherein the silicon-containing polymer has a weight average molecular weight of about 22,000 to about 65,000.

14. The method of claim 9, wherein the solvent comprises at least one selected from benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, and a combination thereof.

15. The method of claim 9, wherein the silicon-containing polymer is included in an amount of about 0.1 to about 30 wt % based on the total amount of the composition for forming a silica layer.

16. A composition for forming a silica layer, comprising: a silicon-containing polymer and a solvent, wherein the silicon-containing polymer comprises a silicon-containing polymer having a weight average molecular weight of about 46,000 to about 65,000 and a polydispersity index of about 5.0 to about 17.0.

* * * * *